United States Patent
Satou

(10) Patent No.: US 10,305,634 B2
(45) Date of Patent: May 28, 2019

(54) COMMUNICATION SYSTEM

(71) Applicant: FANUC CORPORATION, Yamanashi (JP)

(72) Inventor: Kazuhiro Satou, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/298,394

(22) Filed: Oct. 20, 2016

(65) Prior Publication Data
US 2017/0117988 A1   Apr. 27, 2017

(30) Foreign Application Priority Data

Oct. 23, 2015 (JP) .................. 2015-209325

(51) Int. Cl.
*H03M 13/00* (2006.01)
*H04L 1/00* (2006.01)
*H03M 13/13* (2006.01)
*H03M 13/29* (2006.01)

(52) U.S. Cl.
CPC .......... *H04L 1/0076* (2013.01); *H03M 13/13* (2013.01); *H03M 13/2906* (2013.01); *H03M 13/611* (2013.01); *H03M 13/6508* (2013.01); *H03M 13/6516* (2013.01); *H04L 1/0041* (2013.01); *H04L 1/0045* (2013.01); *H04L 1/0057* (2013.01); *H04L 1/0058* (2013.01)

(58) Field of Classification Search
None
See application file for complete search history.

(56) References Cited

U.S. PATENT DOCUMENTS

| 5,935,268 A * | 8/1999 | Weaver ................. H03M 13/09 714/758 |
| 6,038,694 A | 3/2000 | Swallow |
| 2004/0101274 A1* | 5/2004 | Foisy ................ H03M 13/3761 386/201 |
| 2008/0008117 A1* | 1/2008 | Alizadeh-Shabdiz .... G01S 5/02 370/328 |

(Continued)

FOREIGN PATENT DOCUMENTS

| JP | H09114776 A | 5/1997 |
| JP | 11-185399 A | 7/1999 |

(Continued)

*Primary Examiner* — Mujtaba M Chaudry
(74) *Attorney, Agent, or Firm* — Hauptman Ham, LLP

(57) ABSTRACT

A plurality of units have a transmitter and a receiver. The transmitter puts the unit's own data string into a coding data array using first array information, and calculates an error-correcting code based on the data array in which 0 is put except for the data string. The receiver decodes a data array in which a data string is put into the coding data array based on second array information, using an error-correcting code. The transmitter adds the unit's own data string to a data string, puts the unit's own data string into the coding data array using the first array information on the data string, calculates an error-correcting code for the data array in which 0 is put except for the data string, and determines an error-correcting code of a transmission packet by addition of an error-correcting code of a received packet and the calculated error-correcting code.

5 Claims, 8 Drawing Sheets

(56) References Cited

U.S. PATENT DOCUMENTS

| | | | | |
|---|---|---|---|---|
| 2012/0079339 A1* | 3/2012 | Lu | ................... | H04L 1/1621 |
| | | | | 714/751 |
| 2013/0259235 A1* | 10/2013 | Yao | ................ | H04L 9/0827 |
| | | | | 380/279 |
| 2014/0325302 A1* | 10/2014 | Lee | ................ | H04L 1/0035 |
| | | | | 714/751 |
| 2016/0093952 A1* | 3/2016 | Aoki | ............... | H04B 7/0695 |
| | | | | 342/367 |

FOREIGN PATENT DOCUMENTS

| | | |
|---|---|---|
| JP | 2011-106855 A | 6/2011 |
| JP | 2013050836 A | 3/2013 |

* cited by examiner

COMMUNICATION SYSTEM

RELATED APPLICATIONS

The present application claims priority to Japanese Patent Application Number 2015-209325, filed Oct. 23, 2015, the disclosure of which is hereby incorporated by reference herein in its entirety.

BACKGROUND OF THE INVENTION

1. Field of the Invention

The present invention relates to a communication system, and specifically relates to a communication system for controlling a motor of a machine tool.

2. Description of Related Art

Systems in which a many units transmit a small amount of data to each other at short intervals, such as communication systems for controlling a motor of a machine tool, have such a problem that a header, a footer, and the like form a high proportion of a communication packet relative to transmission data, and cause an increase in overhead. Therefore, a method in which a plurality of units share header information for data transmission has been proposed to improve communication efficiency (for example, Japanese Unexamined Patent Publication (Kokai) No. H9-114776, hereinafter referred to as "patent document 1"). However, patent document 1 does not describe a method for sharing an error-correcting code among the plurality of units. Thus, an error-correcting code is required to be added to transmission data of each individual unit. Since the lengths of burst errors occurring in transmission lines are increasing with an increase in the speed of communication, it is expected in the future that an error-correcting code for communication data is accordingly required to be long. Therefore, in order to prevent an increase in the communication overhead, a method for sharing an error-correcting code among the plurality of units is necessary.

When an error-correcting code is simply shared among a plurality of units, a delay due to the recalculation of the error-correcting code becomes a problem. When a unit adds its own data to a received packet and transmits a transmission packet, the unit has to have completed an error correction for the received packet before calculating an error-correcting code for the transmission packet. Thus, the error-correcting code is necessarily transmitted after the reception of the entire received packet, thus causing the occurrence of a delay. Since industrial machines such as machine tools place importance on communication responsivity, such a delay is desirably minimized as much as possible.

Next, the reason why, in the conventional art, a delay occurs in recalculation of an error-correcting code will be described. FIG. 1 shows an example of a conventional technique in which a plurality of units share header information of a packet. In this example, a second unit 1002 merges its own data DATA2 with a packet P3 received from a third unit 1003 into one packet P2, and transmits the packet P2 to a first unit 1001. At this time, the second unit 1002 transmits a header, the transmission data DATA2, an error-correcting code ECC2 for the transmission data DATA2, and then DATA3 and an error-correcting code ECC3 received from the third unit 1003 as is. The DATA3 and the ECC3 are not required to be buffered in the second unit 1002, and are transmitted as they are received. Thus, no delay occurs when the second unit 1002 passes the packet P3. However, in this method, each unit adds an error-correcting code for its own data on an individual basis, thus increasing communication overhead.

On the contrary, when a plurality of units share an error-correcting code in a simple manner, a delay occurs owing to recalculation of the error-correcting code. In FIG. 1, consider a case in which the second unit 1002 calculates an error-correcting code based on the entirety of the DATA2 and the DATA3. In this case, the second unit 1002 becomes able to calculate an error-correcting code based on the entirety of the DATA2 and the DATA3, only after the second unit 1002 has completely received both of the DATA3 and the ECC3. Thus, after the reception of the DATA3 and the ECC3, the second unit 1002 becomes able to start transmitting the error-correcting code. Therefore, as compared with the method of adding an error-correcting code on an individual basis, as described above, a delay is increased by time for the packet P3 to pass the second unit 1002.

Against this backdrop, in a communication system in which a plurality of units use a common packet in data transmission, an error-correcting code is required to be recalculated with high efficiency, when data is added to the packet.

To recalculate an error-correcting code with high efficiency at the time of a data update, a method in which a linear code is used as the error-correcting code, and an error-correcting code for updated data is calculated and added to an original error-correcting code is known (for example, Japanese Unexamined Patent Publication (Kokai) No. 2013-50836). This method allows an update of an error-correcting code for an update of data that is representable by simple addition. However, this method cannot deal with an update of data requiring a data shift. In other words, when data is added to a packet, an update may require a data shift in the packet, so the above method cannot be applied as is.

SUMMARY OF THE INVENTION

The present invention aims at providing a communication system in which a plurality of units use a common packet for data transmission, and when data is added to the packet, an error-correcting code is recalculated with high efficiency.

A communication system according to an embodiment of the present invention includes a plurality of units and a transmission line for connecting the plurality of units. The plurality of units transmit and receive a packet that is a collection of communication data including a data string, a linear error-correcting code for the data string, and additional data including a header through the transmission line. The plurality of units include a transmitter having a first memory for storing first array information to put the unit's own data string into a coding data array that is a data array used for coding and decoding, and a receiver having a second memory for storing second array information to put a data string of a received packet into the coding data array. To decode the received packet, the receiver decodes a data array in which the received data string is put into the coding data array based on the second array information, using an error-correcting code. To transmit the received packet to another unit, the transmitter adds the unit's own data string to the data string of the received packet, puts the unit's own data string into the coding data array using the first array information on the added data string, calculates an error-correcting code based on the data array in which 0 is put except for the data string, and determines an error-correcting code of a transmission packet by the addition of the error-correcting code contained in the received packet and the calculated error-correcting code.

BRIEF DESCRIPTION OF THE DRAWINGS

The objects, features, and advantages of the present invention will be more apparent from the following description of embodiments in conjunction with the attached drawings, wherein.

DETAILED DESCRIPTION OF THE INVENTION

A communication system according to the present invention will be described below with reference to the drawings.

First Embodiment

Figure 1:
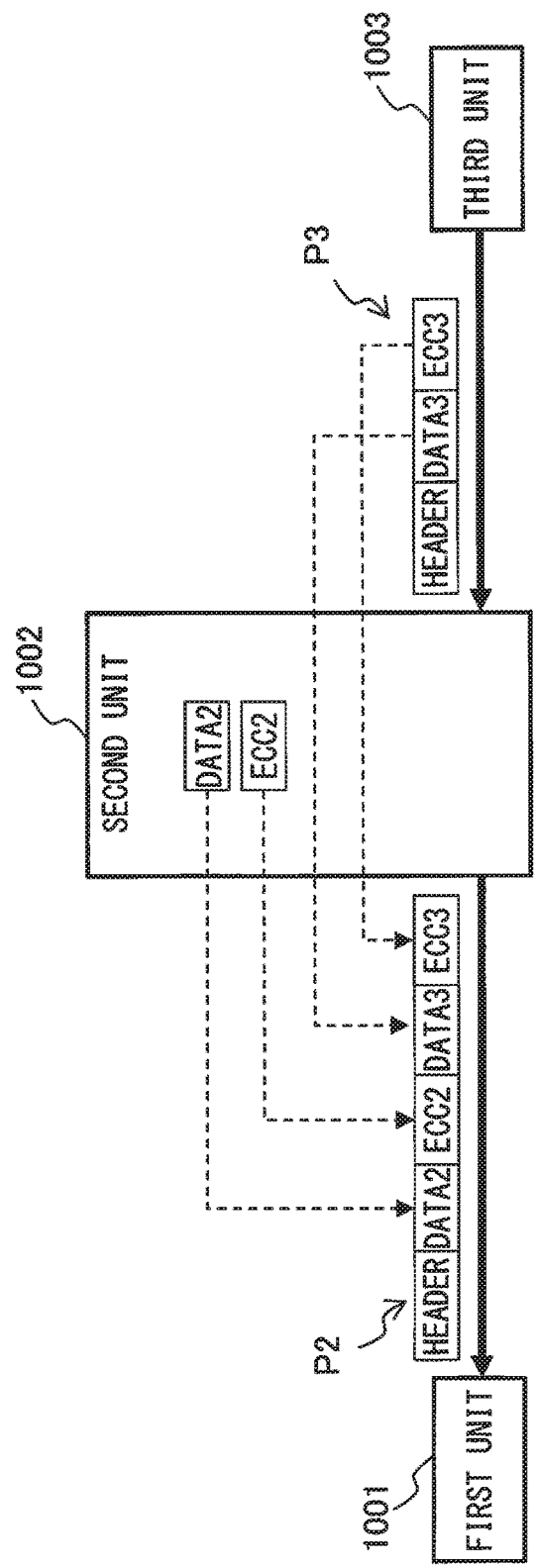
FIG. 1 is a drawing of an example in which a plurality of units transmit and receive packets among which header information is shared, according to conventional art.
Figure 2:
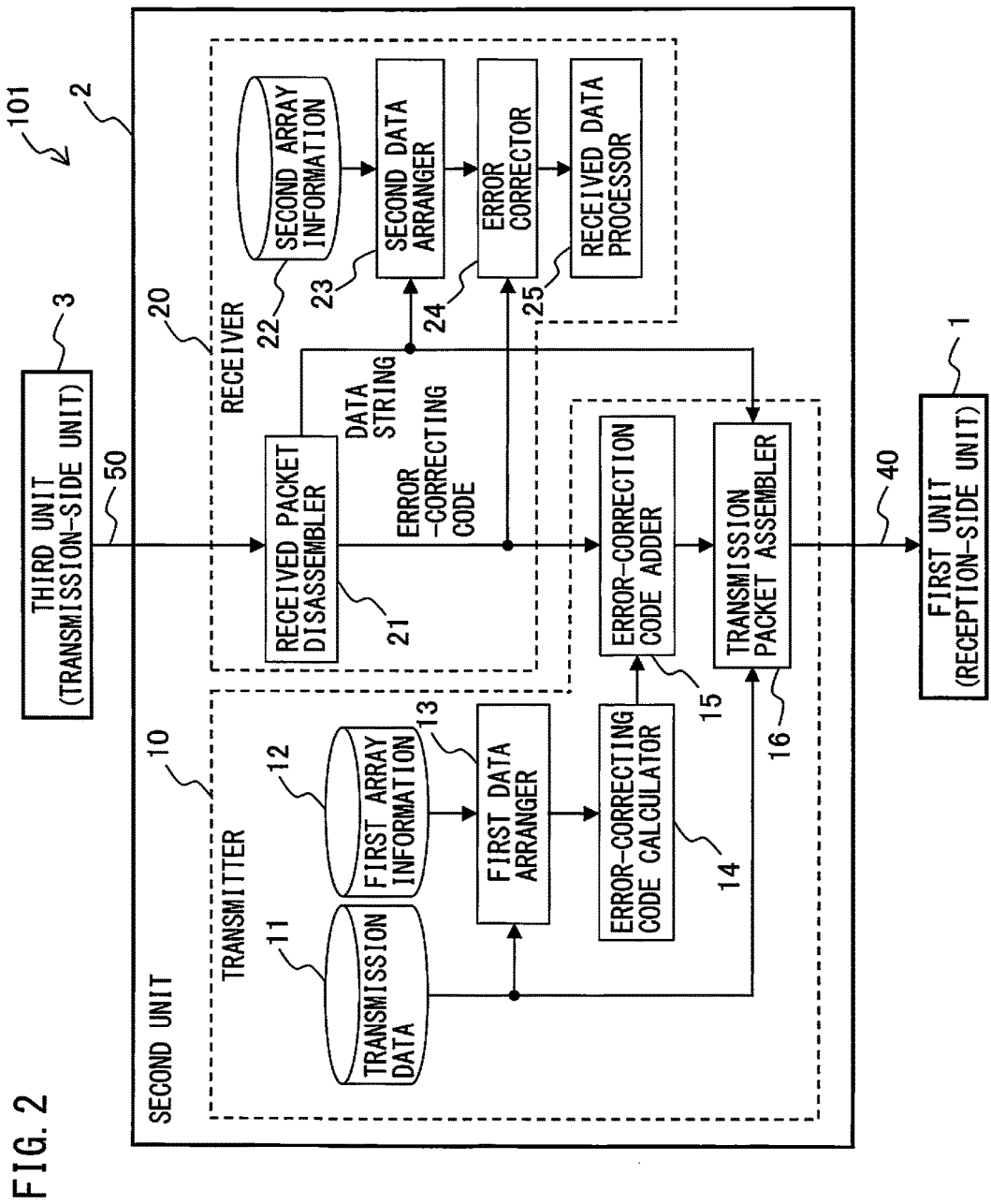
FIG. 2 is a block diagram of a communication system according to a first embodiment of the present invention.

A communication system according to a first embodiment of the present invention will be described. FIG. 2 is a block diagram of the communication system according to the first embodiment of the present invention. A communication system 101 according to the first embodiment of the present invention includes a plurality of units 1 to 3, and transmission lines 40 and 50 for connecting the plurality of units. The plurality of units 1 to 3 transmit and receive packets, that is, collections of communication data constituted of a data string, a linear error-correcting code for the data string, and additional data including a header, through the transmission lines 40 and 50.

In FIG. 2, the communication system 101 includes the first unit 1, the second unit 2, and the third unit 3. In this example, the second unit 2 merges its own data with a packet received from the third unit 3 into another packet, and transmits the merged packet to the first unit 1. However, this configuration is merely an example, and the number of the units may be four or more.

The second unit 2 includes a receiver 20 for receiving data from the third unit 3, and a transmitter 10 for transmitting data to the first unit 1. The transmitter 10 includes a transmission data memory 11, a first memory 12, a first data arranger 13, an error-correcting code calculator 14, an error-correcting code adder 15, and a transmission packet assembler 16.

The transmission data memory 11 stores the unit's own data string, that is, data of the second unit 2. The first memory 12 stores first array information. The first array information is information for putting the unit's own data string into a coding data array. The first data arranger 13 puts the unit's own data string into the coding data array using the first array information. The "coding data array" is a data array used for coding and decoding. The error-correcting code calculator 14 calculates an error-correcting code based on the data array in which 0 is put except for the data string. The error-correcting code adder 15 adds the error-correcting code calculated by the error-correcting code calculator 14 to an error-correcting code contained in the received packet. The transmission packet assembler 16 assembles the unit's own data string, a data string of the received packet, and an error-correcting code as a result of the above addition into a transmission packet, and transmits the transmission packet to the first unit 1.

The receiver 20 includes a received packet disassembler 21, a second memory 22, a second data arranger 23, an error corrector 24, and a received data processor 25.

The received packet disassembler 21 disassembles data (received packet) received from the third unit 3, which is a transmission-side unit, into a data string, i.e., actual transmission data and an error-correcting code. The second memory 22 stores second array information to put the data string of the received packet into the coding data array. The second array information is information for putting the data string of the received packet into the coding data array. To decode the received packet, the second data arranger 23 puts the data string of the received packet into the coding data array using the second array information. The error corrector 24 decodes the data array having the data string therein, using the error-correcting code. The received data processor 25 processes the corrected data.

Figure 3:
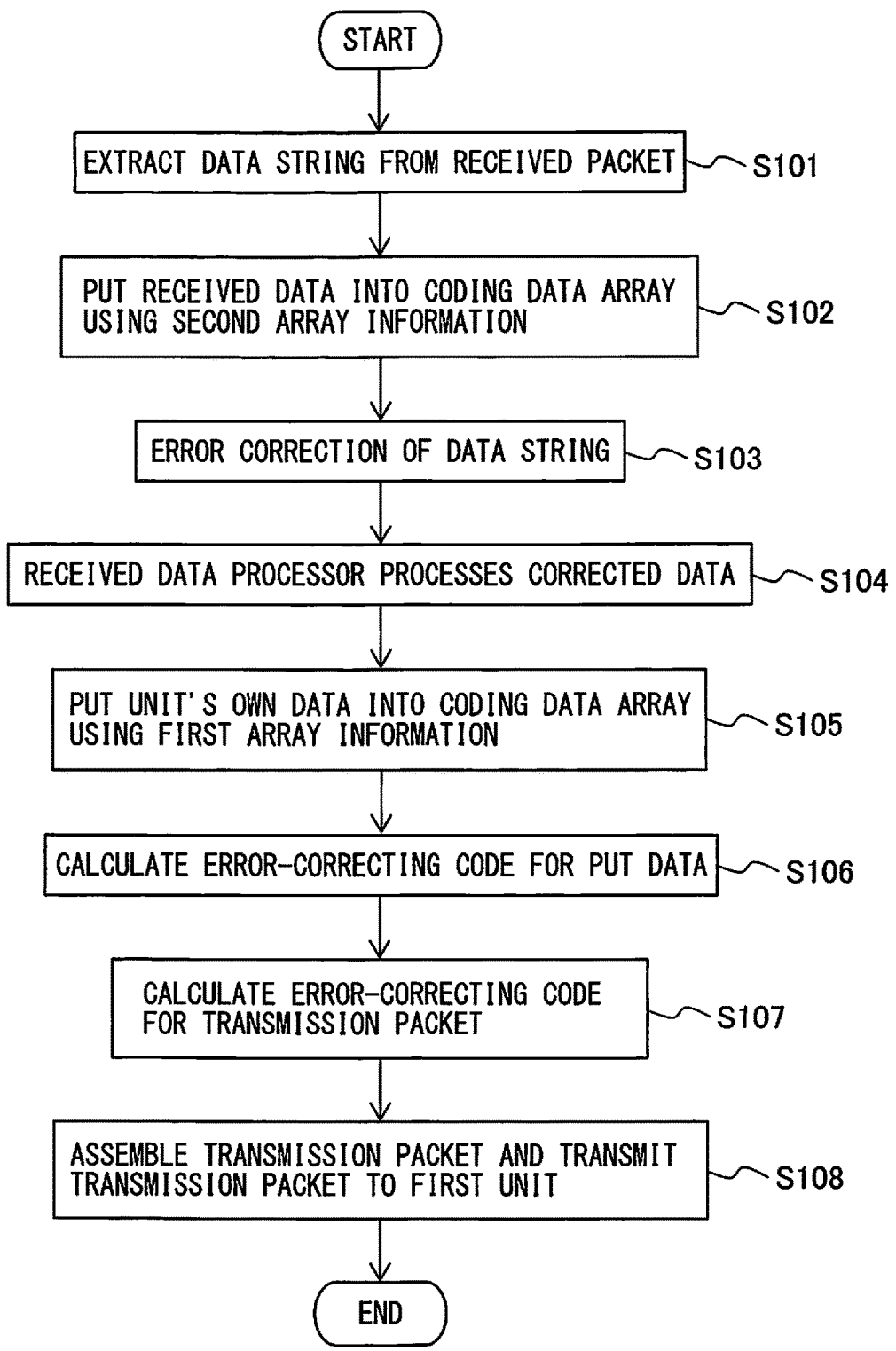
FIG. 3 is a flowchart of the operation of the communication system according to the first embodiment of the present invention.

Next, the operation of the communication system according to the first embodiment of the present invention will be described with reference to a flowchart of FIG. 3. First, in step S101, the received packet disassembler 21 provided in the receiver 20 of the second unit 2 extracts a data string, i.e., actual communication data from a received packet. The received packet disassembler 21 transmits the extracted data string to the second data arranger 23. The received packet disassembler 21 also extracts an error-correcting code from the received packet, i.e., received data, and outputs the error-correcting code to the error corrector 24.

Next, in step S102, the second data arranger 23 puts the received data string into the coding data array, which is a data array used for coding and decoding, using the second array information. The second data arranger 23 outputs the data array having the data string put therein to the error corrector 24.

Next, in step S103, the error corrector 24 applies an error correction to the data array, using the data string put into the coding data array and the error-correcting code of the received packet.

Next, in step S104, the received data processor 25 processes the corrected data.

Next, in step S105, the first data arranger 13 provided in the transmitter 10 puts the unit's own data string stored in the transmission data memory 11 into the coding data array using the first array information. The first data arranger 13 outputs the data array having the data string therein, to the error-correcting code calculator 14.

Next, in step S106, the error-correcting code calculator 14 calculates an error-correcting code based on the data array. The error-correcting code calculator 14 outputs a calculation result, that is, the error-correcting code for the unit's own data string to the error-correcting code adder 15.

Next, in step S107, the error-correcting code adder 15 calculates an error-correcting code of a transmission packet by the addition of the error-correcting code as the calculation result and the error-correcting code of the received packet. The error-correcting code adder 15 outputs the calculated error-correcting code of the transmission packet to the transmission packet assembler 16.

Next, in step S108, the transmission packet assembler 16 assembles the unit's own data string, the data string of the received packet, and the error-correcting code as the above calculation result into the transmission packet, and transmits the transmission packet to the first unit 1.

Note that, in this example, the transmission system is constituted of the unit that performs both transmission and reception, but a unit that performs only transmission or a unit that performs only reception may be used instead. In this case, a unit constituted of only the above-described transmitter or receiver may be substituted for the unit that performs only transmission or reception, respectively.

Figure 4:
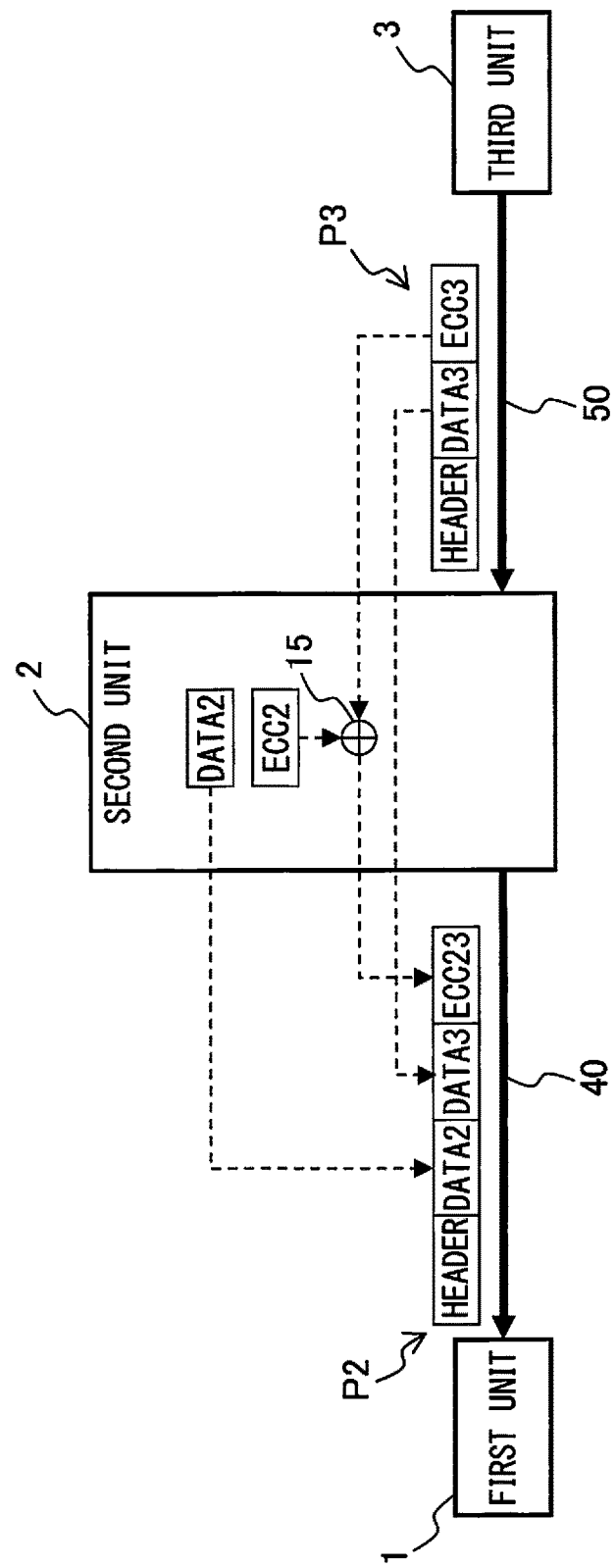
FIG. 4 is a drawing of an example in which a plurality of units transmit and receive packets among which header information and an error-correcting code are shared in the communication system according to the first embodiment of the present invention.

Next, a method for calculating an error-correcting code, which is a feature of the communication system according to the first embodiment of the present invention, will be described. FIG. 4 is a drawing showing an example in which the plurality of units transmit and receive packets among which header information is shared, in the communication system according to the first embodiment of the present invention. In FIG. 4, the second unit 2 first transmits a header and its own transmission data DATA2 as a transmission packet P2 for the first unit 1. After that, the second unit 2 transmits DATA3 that is included in a packet P3 received from the third unit 3. After that, the second unit 2 transmits an error-correcting code ECC23 for the entirety of the DATA2 and the DATA3.

At this time, a linear code is used as an error-correcting code, and the error-correcting code is calculated based on the coding data array, as described later. Thus, the error-correcting code adder 15 can calculate the error-correcting code ECC23 by the addition of an error-correcting code ECC2 for DATA2 and an error-correcting code ECC3 for DATA3. The addition of the error-correcting code can be performed independently on a bit-by-bit basis. Thus, whenever receiving one bit of the ECC3, the second unit 2 adds the ECC2 to the ECC3, and transmits a calculation result as the ECC23 on a bit-by-bit basis.

As described above, since the ECC23 can be transmitted without waiting for the completion of the reception of the ECC3, it is possible to calculate an error-correcting code that is sharable among data of a plurality of units without an increase in a delay owing to the passage of a packet. Note that, the above-described order of data is merely an example, and in this embodiment, the order of data in the packets is not limited to the above example.

A method for updating an error-correcting code using addition will be hereinafter described. This invention uses the definition of linear codes, that is, "if EA is a code for A and EB is a code for B, (EA+EB) is a code for (A+B)".

Here, A represents original data, and B represents update data. A code for data after an update is the sum (EA+EB) of a code EA for the original data before the update and a code EB for the update data. However, simply using this definition allows an update of an error-correcting code corresponding to an update of data representable by simple addition, but cannot deal with an update requiring a data shift. In the above example, the second unit adds the data DATA2 in front and the DATA3 is shifted to the rear. Thus, this definition cannot be applied in a simple manner.

Figure 5:
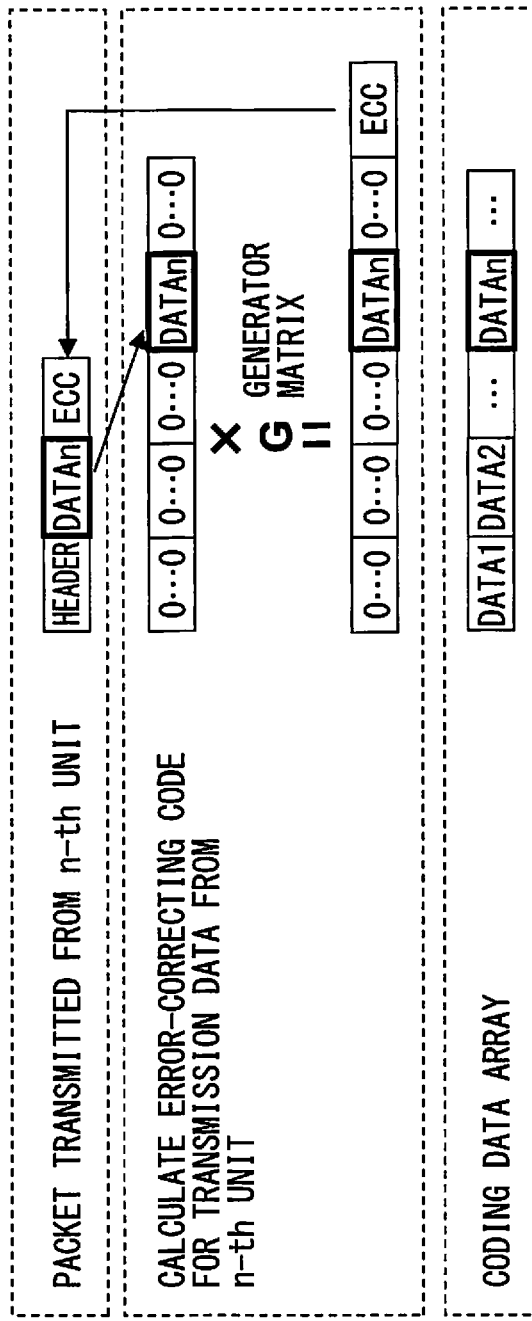
FIG. 5 is a drawing of an example in which an error-correcting code for transmission data is calculated based on a coding data array in the communication system according to the first embodiment of the present invention.
Figure 6:
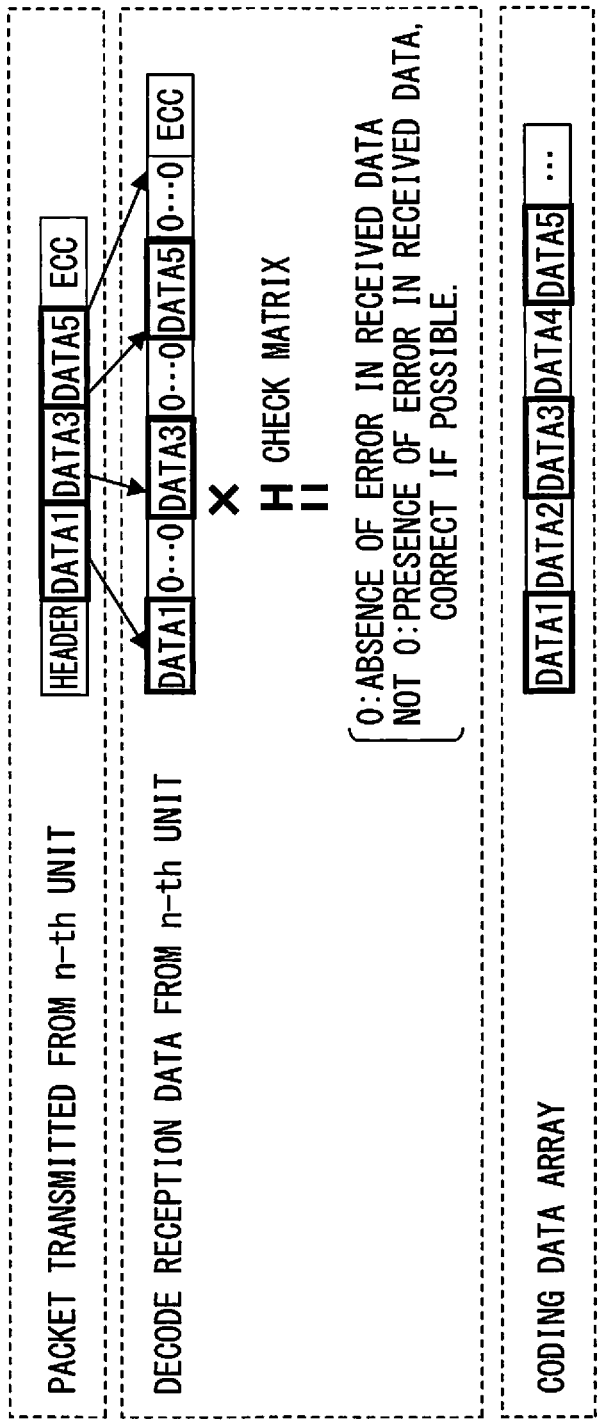
FIG. 6 is a drawing of an example in which an error-correcting code for reception data is calculated based on the coding data array in the communication system according to the first embodiment of the present invention.

Accordingly, an error-correcting code is calculated by mapping data in a different data array from a data array in a packet. This data array is hereinafter referred to as "coding data array". FIG. 5 shows an example in which an error-correcting code for transmission data is calculated using the coding data array. FIG. 6 shows an example in which an error-correcting code for reception data is calculated using the coding data array.

In the example of the transmission data shown in FIG. 5, an error-correcting code ECC is calculated based on a data array in which data DATAn transmitted from an n-th unit is put in a corresponding position of the coding data array and 0 is put to all the other bits, using a generator matrix G.

In the example of the reception data shown in FIG. 6, an error is detected and corrected based on a data array in which data DATA1, DATA3, and DATA5 transmitted from an n-th unit is put in corresponding positions of the coding data array and 0 is put to all the other bits, using a check matrix H.

Note that, a coding is performed based on a data array using the summed generator matrix and an error detection is performed using the summed check matrix in this example, but methods for the coding and the error detection are not limited thereto, but other general methods can be used instead.

As described above, mapping data in the coding data array allows updating an error-correcting code by simple addition, because even if the position of data changes in a packet, the position of data does not change in the coding data array.

Second Embodiment

Figure 7:
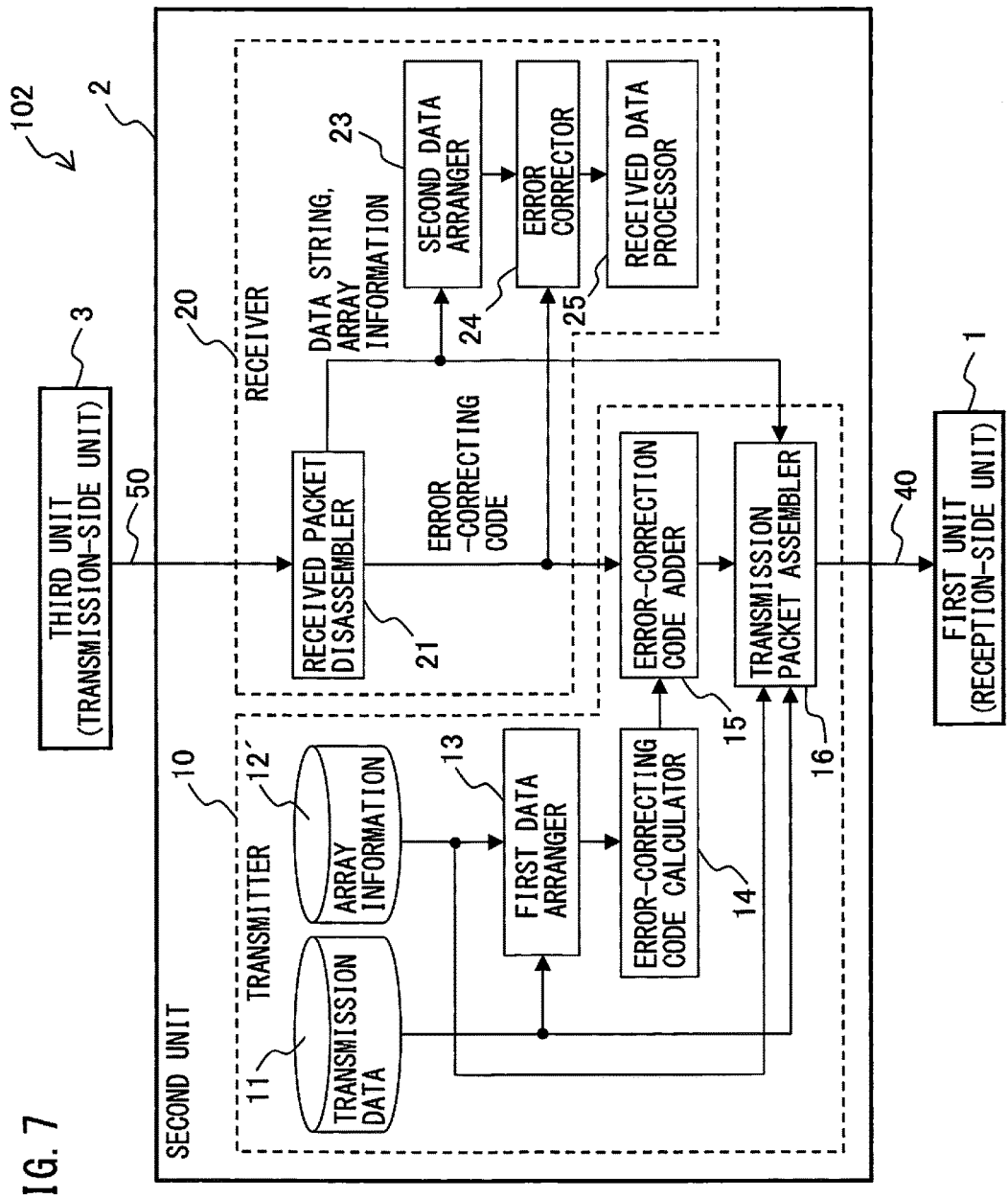
FIG. 7 is a block diagram of a communication system according to a second embodiment of the present invention.

Next, a communication system according to a second embodiment of the present invention will be described. FIG. 7 is a block diagram of the communication system according to the second embodiment of the present invention. The difference between a communication system 102 according to the second embodiment of the present invention and the communication system 101 according to the first embodiment of the present invention is as follows. A plurality of units 1 to 3 each include a transmitter 10 that has a memory 12' for storing array information that is used for putting the unit's own data string into the coding data array, that is, a data array used for coding and decoding. When starting a packet transmission, the transmitter 10 puts the unit's own data string into the coding data array using the array information. The transmitter 10 calculates an error-correcting code based on the data array in which 0 is put except for the data string, and transmits a transmission packet with the addition of the array information. When the receiver 20 that has received the packet decodes the received packet, the receiver 20 decodes a data array in which the received data string is put into the coding data array based on the array information contained in the received packet, using the error-correcting code. The other configurations of the communication system 102 according to the second embodiment are the same as those of the communication system 101 according to the first embodiment, so a detailed description thereof will be omitted.

In this example, in the communication system constituted of the first unit 1, the second unit 2, and the third unit 3, the second unit 2 merges its own data string with a packet received from the third unit 3 into another packet, and transmits the packet to the first unit 1.

The receiver 20 of the second unit 2 puts a data string extracted from the received packet in the coding data array using the array information contained in the received packet. The second unit 2 corrects an error based on the data array in which the data string is put into the coding data array and the error-correcting code contained in the received packet, and processes the corrected data at the received data processor 25.

The transmitter 10 puts the unit's own data string into the coding data array using the array information stored in the memory 12' provided in the second unit 2, and calculates an error-correcting code based on the data array having the data string therein. The transmitter 10 then calculates an error-correcting code for a transmission packet by the addition of the calculated error-correcting code and the error-correcting code contained in the received packet. The second unit 2 assembles its own data string, the data string contained in the received packet, the array information for its own data string, the array information contained in the received packet, and the above calculation result of the error-correcting code into a transmission packet, and transmits the transmission packet to the first unit 1.

Note that, in this example, the communication system is constituted of the unit that performs both transmission and reception, but a unit that performs only transmission or a unit that performs only reception may be used instead. In this case, a unit constituted of only the above-described transmitter or receiver may be substituted for the unit that performs only transmission or reception, respectively.

Third Embodiment

Figure 8:
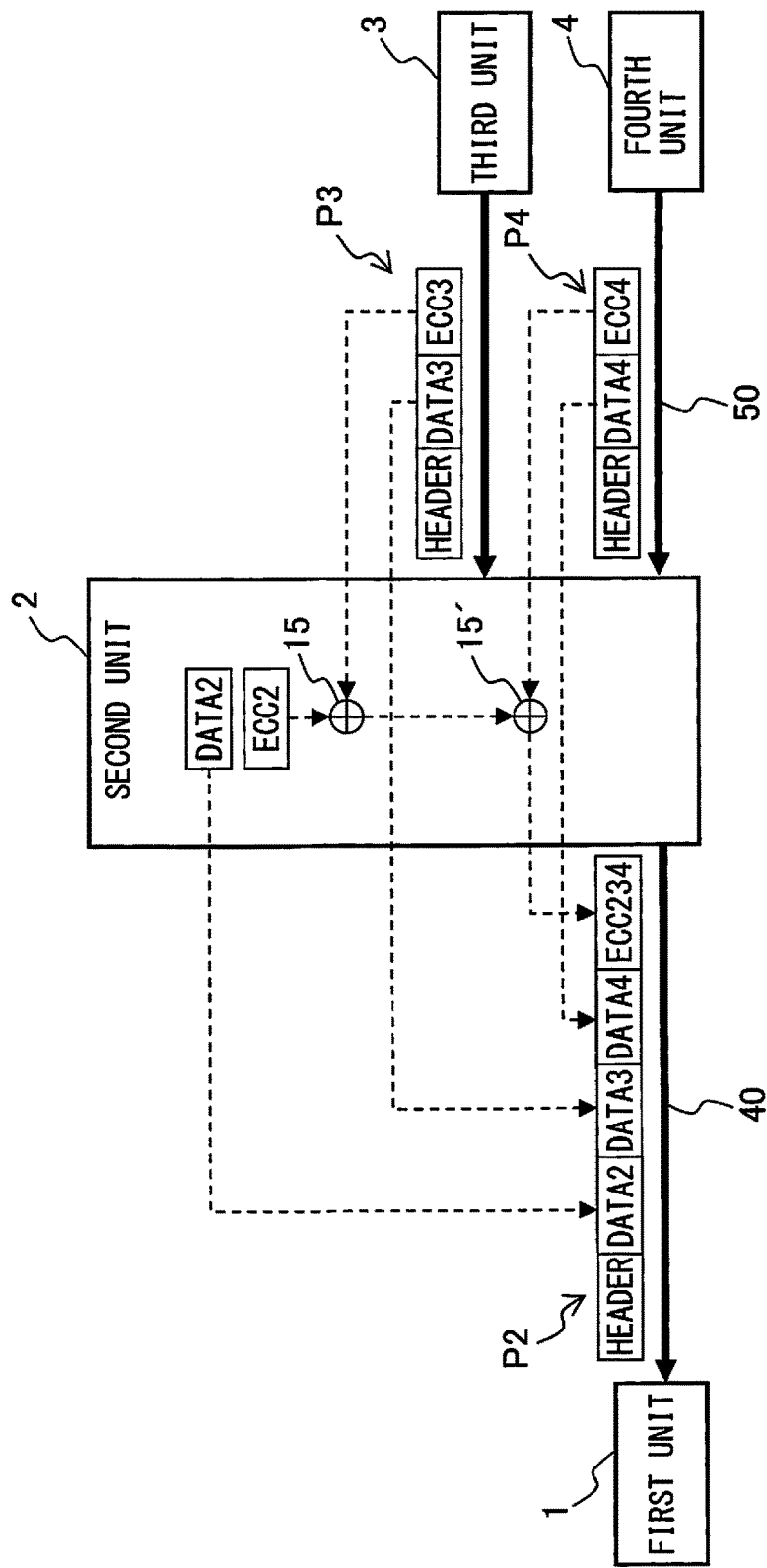
FIG. 8 is a drawing of an example in which a plurality of units transmit and receive packets among which header information and an error-correcting code are shared in a communication system according to a third embodiment of the present invention.

Next, a communication system according to a third embodiment of the present invention will be described. FIG. 8 shows an example in which a plurality of units transmit and receive packets among which header information and an error-correcting code are shared, in the communication system according to the third embodiment of the present invention. The difference between the communication system according to the third embodiment of the present invention and the communication system 101 according to the first embodiment of the present invention is as follows. The communication system includes a reception-side unit that merges packets received from a plurality of units into a new packet and transmits the new packet to another unit. When merging the plurality of received packets into the transmission packet, if the reception-side unit adds its own data string to the transmission packet, the reception-side unit puts its own data string into the coding data array. The reception-side unit calculates an error-correcting code based on the data array in which 0 is put except for the data string. The reception-side unit recalculates a new error-correcting code by the addition of all error-correcting codes, including error-correcting codes contained in the plurality of received packets and the calculated error-correcting code. The other configurations of the communication system according to the third embodiment are the same as those of the communication system 101 according to the first embodiment, so a detailed description thereof will be omitted.

In the communication system according to the third embodiment, a second unit 2 merges a packet P3 received from a third unit 3, a packet P4 received from a fourth unit 4, and its own transmission data DATA2 into one packet, and transmits the packet to a first unit 1. At this time, the second unit 2 transmits a header, its own transmission data DATA2, DATA3 received from the third unit 3, DATA4 received from the fourth unit 4, and an error-correcting code ECC234 based on the entirety of the DATA2, the DATA3, and the DATA4, in this order.

The ECC234 is calculated by error-correcting code adders 15 and 15' by the addition of all error-correcting codes, that is, an ECC2 for the DATA2, an ECC3 for the DATA3, and an ECC4 for the DATA4. Note that, in the calculation of each error-correcting code, a data string is put into the coding data array, as described in the first and second embodiments.

The reception-side unit decodes a data string that is put into the coding data array using the array information stored in the unit, merely as in the case of the first embodiment, or using the array information stored in the packet, merely as in the case of the second embodiment.

As described above, when the plurality of reception packets and the unit's own data string are combined and assembled into a new transmission packet, an error-correcting code can be calculated based on the entirety of data by the addition of error-correcting codes for data of individual units. In this embodiment, the packets are received from two units, but the present invention is applicable in a similar manner when packets are received from three or more units.

According to the communication system of the embodiments of the present invention, when data is added to a packet, an error-correcting code can be recalculated with high efficiency.

What is claimed is:

1. A communication system for controlling a motor of a machine tool, the communication system comprising:
    a plurality of units including a first, a second and a third units; and
    a transmission line connecting the plurality of units, wherein
    each of the plurality of units is configured to transmit and receive, through the transmission line, a packet that is a collection of communication data including
        a data string,
        a linear error-correcting code for the data string, and
        additional data including a header,
    the second unit receives, from the third unit, a received packet including
        a third data string which is the third unit's own data string,
        a third error-correcting code for the third data string, and
        the additional data, and
    the second unit includes:
        a transmitter having
            a transmission data memory for storing a second data string which is the second unit's own data string, and
            a first memory for storing first array information to put the second data string into a second data array for coding and decoding, and
        a receiver having
            a second memory for storing second array information to put the third data string included in the received packet received from the third unit into a third data array for coding and decoding,
        to decode the received packet received from the third unit, the receiver of the second unit is configured to decode the third data array in which the third data string of the received packet is put into a coding data array based on the second array information stored in the second memory, using the third error-correcting code contained in the received packet received from the third unit, wherein decoded data of the third data array containing the third data string is processed by a processor of the receiver of the second unit for controlling the motor of the machine tool, and to transmit a transmission packet assembled by the second unit to the first unit, the transmitter of the second unit is configured to add the second data string stored in the transmission data memory to the third data string contained in the received packet received from the third unit, put the second data string into the second data array using the first array info illation stored in the first memory, calculate a second error-correcting code based on the second data array in which the second data string is put in a corresponding position of the coding data array and 0 is put in other bits, and combine the third error-correcting code contained in the received packet from the third unit with the calculated second error-correcting code as a combined error-correcting code of the transmission packet assembled by the second unit to be transmitted to the first unit, wherein the transmission packet is transmitted to the first unit independently of the processing of the decoded data containing the third data string by the processor of the receiver of the second unit.

2. The communication system according to claim 1, wherein the plurality of units further includes a fourth unit connecting to the second unit through the transmission line, wherein the second unit is configured to generate a new packet merged by a combination of packets received from the third and the fourth units, and transmit the new packet to the first unit, wherein to generate the new packet by the combination of the received packets, the second unit is configured to recalculate a new error-correcting code by the addition of all error-correcting codes contained in the packets received from the third and the fourth units and an error-correcting code calculated based on a data array in which the second unit's own data string is put into the coding data array and 0 is put in other bits.

3. The communication system according to claim 1, wherein the transmitter of the second unit further comprises a transmission packet assembler configured to assemble the transmission packet as including the second data string of the second unit, the third data string of the received packet from the third unit, and the combined error-correcting code of the transmission packet.

4. A communication system for controlling a motor of a machine tool, the communication system comprising:

a plurality of units including a first, a second and a third units; and a transmission line connecting the plurality of units, wherein each of the plurality of units is configured to transmit and receive, through the transmission line, a packet that is a collection of communication data including a data string, a linear error-correcting code for the data string, and additional data including a header, the second unit receives, from the third unit, a received packet including a third data string which is the third unit's own data string, a third error-correcting code for the third data string, second array information to put the third data string into a third data array for coding and decoding, and the additional data, and the second unit includes:

a transmitter having a transmission data memory for storing a second data string which is the second unit's own data string, and a first memory for storing first array information to put the second data string into a second data array for coding and decoding, and a receiver, to decode the received packet received from the third unit, the receiver of the second unit is configured to decode the third data array in which the third data string of the received packet is put into a coding data array based on the second array information contained in the received packet, using the third error-correcting code contained in the received packet received from the third unit, wherein decoded data of the third data array containing the third data string is processed by a processor of the receiver of the second unit for controlling the motor of the machine tool, and to transmit a transmission packet assembled by the second unit to the first unit, the transmitter of the second unit is configured to add the second data string stored in the transmission data memory to the third data string contained in the received packet received from the third unit, put the second data string into the second data array using the first array information stored in the first memory, calculate a second error-correcting code based on the second data array in which the second data string is put in a corresponding position of the coding data array and 0 is put in other bits, combine the third error-correcting code contained in the received packet from the third unit with the calculated second error-correcting code as a combined error-correcting code of the transmission packet assembled by the second unit to be transmitted to the first unit, and transmit, to the first unit, the transmission packet together with the first array information stored in the first memory of the transmitter of the second unit, wherein the transmission packet is transmitted to the first unit independently of the processing of the decoded data containing the third data string by the processor of the receiver of the second unit.

5. The communication system according to claim 4, wherein the transmitter of the second unit further comprises a transmission packet assembler configured to assemble the transmission packet as including the second data string of the second unit,
the third data string of the received packet from the third unit,
the combined error-correcting code of the transmission packet, and
the first array information stored in the first memory of the transmitter of the second unit.

* * * * *